US007295072B2

(12) United States Patent
Takaso et al.

(10) Patent No.: US 7,295,072 B2
(45) Date of Patent: Nov. 13, 2007

(54) AMPLIFIER CIRCUIT

(75) Inventors: Jun Takaso, Tokyo (JP); Tsutomu Yoshimura, Tokyo (JP); Norio Higashisaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 168 days.

(21) Appl. No.: 11/197,376

(22) Filed: Aug. 5, 2005

(65) Prior Publication Data
US 2006/0055457 A1 Mar. 16, 2006

(30) Foreign Application Priority Data
Sep. 15, 2004 (JP) ............... 2004-267838

(51) Int. Cl.
*H03F 3/45* (2006.01)
(52) U.S. Cl. ..................... 330/260; 330/261
(58) Field of Classification Search ........... 330/85, 330/124 R, 253, 259, 260, 295, 310, 261
See application file for complete search history.

(56) References Cited

U.S. PATENT DOCUMENTS

| | | | |
|---|---|---|---|
| 4,542,350 A | 9/1985 | Akazawa et al. | |
| 5,355,094 A | 10/1994 | Soda | |
| 6,831,510 B2 * | 12/2004 | Jiang | ............ 330/85 |

FOREIGN PATENT DOCUMENTS

| | | |
|---|---|---|
| JP | 59-016404 | 1/1984 |
| JP | 61-281710 | 12/1986 |
| JP | 01-137713 | 5/1989 |
| JP | 05-299949 | 11/1993 |

OTHER PUBLICATIONS

Todd "FETs as voltage-variable resistors" Application Notes vol. 13, No. 19, Sep. 13, 1965, pp. 66-68.*
Sherif Galal et al., "10-Gb/s Limiting Amplifier and Laser/Modulator Driver in 0.18-μm CMOS Technology", IEEE Journal of Solid-State Circuits, vol. 38, No. 12, Dec. 2003, pp. 2138-2146.

* cited by examiner

*Primary Examiner*—Evan Pert
(74) *Attorney, Agent, or Firm*—Leydig, Voit & Mayer, Ltd.

(57) ABSTRACT

An amplifier circuit includes a first differential amplifier circuit, a second differential amplifier circuit which amplifies an output signal from the first differential amplifier circuit, and an active feedback circuit which performs waveform shaping on the output signal from the first differential amplifier circuit by feeding back an output signal from the second differential amplifier circuit. The active feedback circuit includes first and second transistors having collectors or drains respectively connected to respective output nodes of the first differential amplifier circuit, bases or gates respectively connected to two output nodes of the second differential amplifier circuit, and emitters or sources connected in common, and a first current source which has a first end connected to the emitters or sources of the first and second transistors, and a second end connected to a low-voltage power supply, and producing a current that can be externally adjusted.

5 Claims, 5 Drawing Sheets

AMPLIFIER CIRCUIT

BACKGROUND OF THE INVENTION

1. Field of the Invention

The present invention belongs to the field of data communication and relates to an amplifier circuit having an active feedback circuit (equalizer circuit) for waveform shaping.

2. Background Art

In an amplifier circuit provided in a data receiving block of a data communication apparatus, one having an active feedback circuit (equalizer circuit) for waveform shaping has been proposed (Sherif Galal and Behzad Razavi, IEEE Journal of Solid-State circuits, vol. 38, No. 12, December 2003, FIG. 5).

In conventional amplifier circuits, the peaking intensity of an active feedback circuit including a peaking value, a peaking return value and a peaking width cannot be externally adjusted. For this reason, the peaking intensity cannot be adjusted to deterioration characteristics of various transmission lines after designing the circuit.

SUMMARY OF THE INVENTION

In view of the above-described problem, an object of the present invention is to provide an amplifier circuit in which the peaking intensity of an active feedback circuit can be externally adjusted.

According to one aspect of the present invention, an amplifier circuit includes a first differential amplifier circuit, a second differential amplifier circuit which amplifies an output signal from the first differential amplifier circuit, and an active feedback circuit which performs waveform shaping on the output signal from the first differential amplifier circuit by feeding back an output signal from the second differential amplifier circuit, the active feedback circuit having first and second transistors having collectors or drains respectively connected to two output nodes of the first differential amplifier circuit, bases or gates respectively connected to two output nodes of the second differential amplifier circuit, and emitters or sources connected in common, and a first current source which has its one end connected to the emitters or sources of the first and second transistors, and the other end connected to a low-voltage power supply, and whose current value can be externally adjusted.

The present invention enables the peaking intensity of the active feedback circuit to be externally adjusted, and thereby enables the peaking intensity to be adapted to deterioration characteristics of various transmission lines after designing of the circuit.

Other and further objects, features and advantages of the invention will appear more fully from the following description.

DETAILED DESCRIPTION OF THE PREFERRED EMBODIMENTS

First Embodiment

Figure 1:
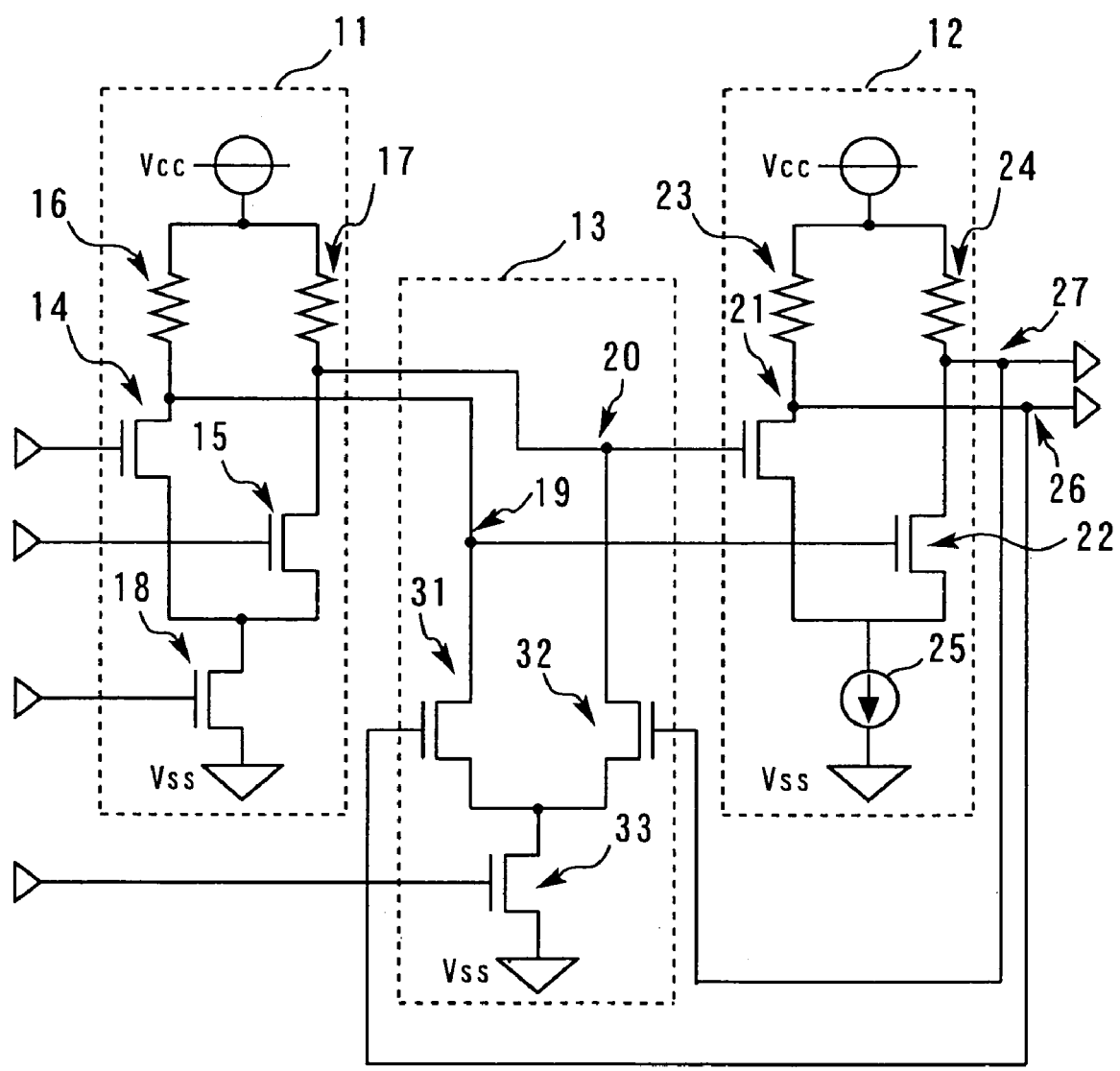
FIG. 1 is a circuit diagram showing an amplifier circuit according to a first embodiment of the present invention.

FIG. 1 is a circuit diagram showing an amplifier circuit according to a first embodiment of the present invention. This amplifier circuit includes a first differential amplifier circuit 11, a second differential amplifier circuit 12 which amplifies an output signal from the first differential amplifier circuit 11, and an active feedback circuit 13 which performs waveform shaping on an output signal from the first differential amplifier circuit 11 by feeding back an output signal from the second differential amplifier circuit 12.

The first differential amplifier circuit 11 has transistors 14 and 15, resistors 16 and 17 and a current source 18. As the transistors 14 and 15, either of bipolar transistors and MOS transistors may be used. The collectors or drains of the transistors 14 and 15 are respectively connected to a high-voltage power supply Vcc through the resistors 16 and 17 and to two output nodes 19 and 20. The bases or gates of the transistors 14 and 15 are respectively connected to two input nodes. The emitters or sources of the transistors 14 and 15 are connected in common to one end of the current source 18. The other end of the current source 18 is connected to a low-voltage power supply Vss. The current source 18 is constituted by a transistor. The current value of the current source 18 can be externally adjusted by adjusting the value of a bias on the gate of this transistor.

The second differential amplifier circuit 12 has transistors 21 and 22, resistors 23 and 24 and a current source 25. As the transistors 21 and 22, either of bipolar transistors and MOS transistors may be used. The collectors or drains of the transistors 21 and 22 are respectively connected to the high-voltage power supply Vcc through the resistors 23 and 24 and to two output nodes 26 and 27. The bases or gates of the transistors 21 and 22 are respectively connected to the two output nodes 20 and 19 of the first differential amplifier circuit 11. The emitters or sources of the transistors 21 and 22 are connected in common to one end of the current source 25. The other end of the current source 25 is connected to the low-voltage power supply Vss.

The active feedback circuit 13 has transistors 31 and 32 and a current source 33. The collectors or drains of the transistors 31 and 32 are respectively connected to the two output nodes 19 and 20 of the first differential amplifier circuit 11. The bases or gates of the transistors 31 and 32 are respectively connected to the two output nodes 26 and 27 of the second differential amplifier circuit 12. The emitters or sources of the transistors 31 and 32 are connected in common to one end of the current source 33. The other end of the current source 33 is connected to the low-voltage power supply Vss. The current source 33 is constituted by a transistor. The current value of the current source 33 can be externally adjusted by adjusting the value of a bias on the gate of this transistor.

In the amplifier circuit arranged as described above, waveform shaping is performed on the output signal from the first differential amplifier circuit 11 by combining the output signal from the active feedback circuit 13 with the output signal from the first differential amplifier circuit 11. Thus, a feedback is directly applied to the output nodes of the first differential amplifier circuit 11. The range of adjustment of the peaking intensity of the output signal is thereby increased. As a result, the desired peaking waveform can be obtained.

Since the input to the active feedback circuit 13 is the output signal from the second differential amplifier circuit 12, the output signal from the active feedback circuit 13 is delayed relative to the output signal from the first differential amplifier circuit 11 by the amount of switching delay through the second differential amplifier circuit 12 and the active feedback circuit 13.

Figure 2:
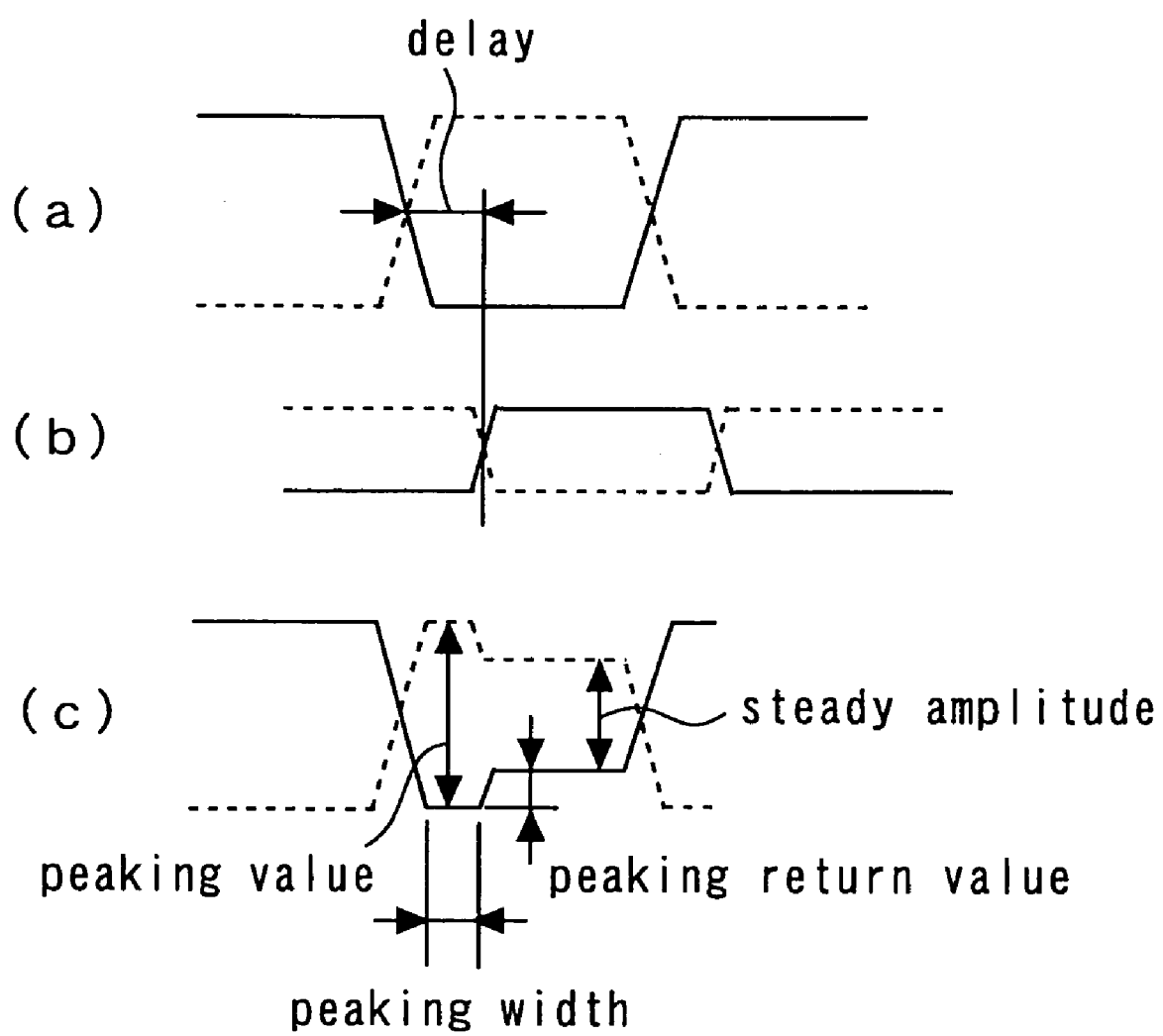
FIG. 2 shows the waveforms of the output signal (a) from the first differential amplifier circuit, the output signal (b) from the active feedback circuit has a peaking, and the signal (c) obtained by combining the output signal (a) and the output signal (b).

Therefore, as shown in FIG. 2, the waveform of the signal (c) obtained by combining the output signal (a) from the first differential amplifier circuit 11 and the output signal (b) from the active feedback circuit has a peaking.

Since the first differential amplifier circuit 11 and the active feedback circuit 13 has the resistors 16 and 17 in common, the current value of the current source 18 of the first differential amplifier circuit 11 and the current value of the current source 33 of the active feedback circuit 13 determine the amplitudes of the respective output signals. Therefore, the peaking value and the peaking return value of the output signal of the first differential amplifier 11 can be adjusted by adjusting the one or both of the current value of the current source 18 of the first differential amplifier circuit 11 and the current value of the current source 33 of the active feedback circuit 13.

More specifically, the peaking value and the peaking return value of the output signal from the first differential amplifier circuit 11 can be reduced by reducing the current value of the current source 33 of the active feedback circuit 13 while constantly maintaining the current value of the current source 18 of the first differential amplifier circuit 11. However, the difference between the peaking value and the steady amplitude is reduced.

On the other hand, the peaking value and the peaking return value of the first differential amplifier circuit 11 can be increased by increasing the current value of the current source 33 of the active feedback circuit 13 while constantly maintaining the current value of the current source 18 of the first differential amplifier circuit 11. However, the difference between the peaking value and the steady amplitude is increased.

Conversely, the current value of the current source 18 of the first differential amplifier circuit 11 maybe changed while constantly maintaining the current value of the current source 33 of the active feedback circuit 13. The same effect can also be achieved in this way. Also, the current values of the two current sources may be changed to achieve the same effect.

Second Embodiment

Figure 3:
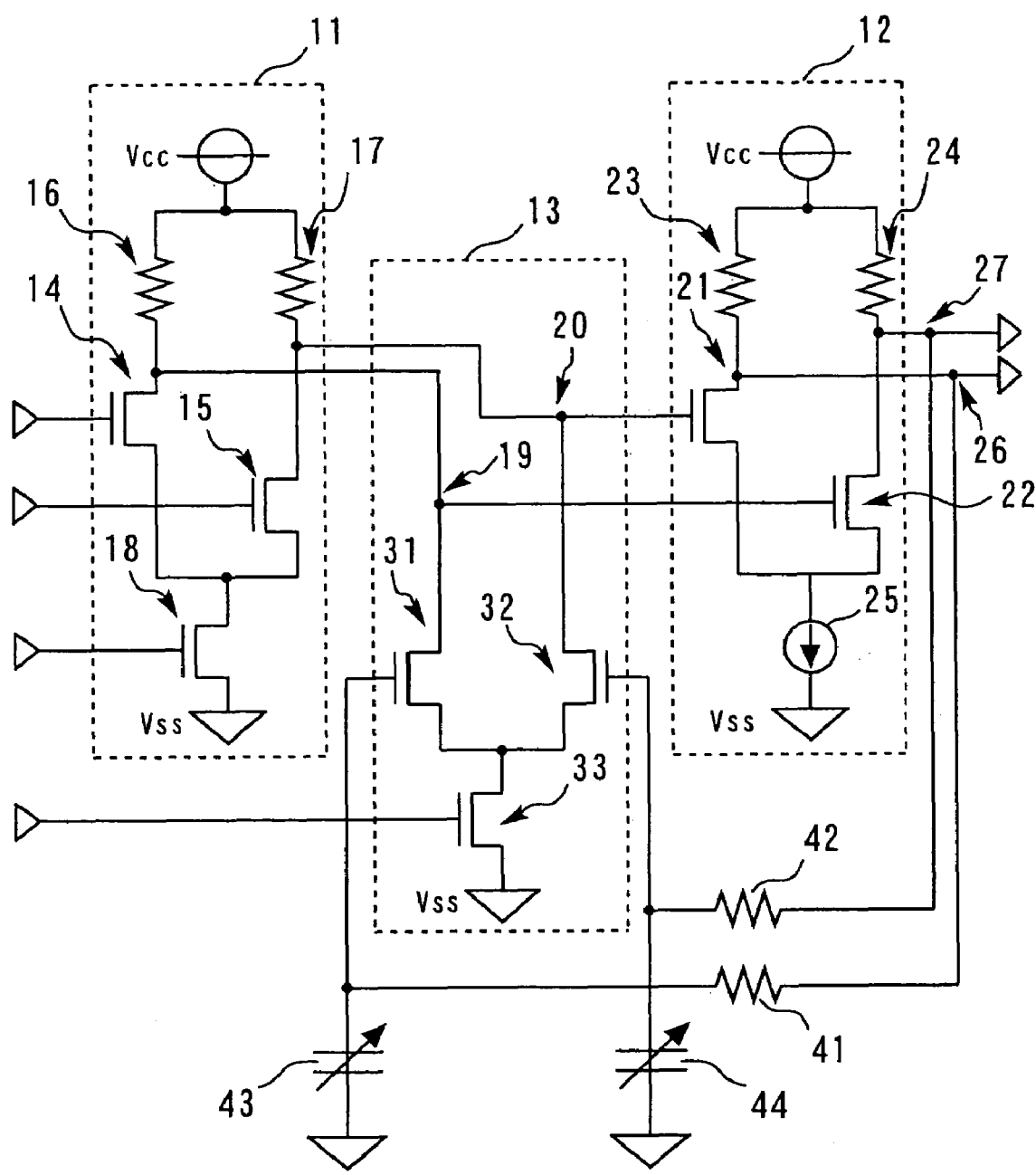
FIG. 3 is a circuit diagram showing an amplifier circuit according to a second embodiment of the present invention.

FIG. 3 is a circuit diagram showing an amplifier circuit according to a second embodiment of the present invention. The same components as those shown in FIG. 1 are indicated by the same reference numerals, and the description for them will not be repeated.

In the amplifier circuit according to the second embodiment, resistors 41 and 42 and the capacitors 43 and 44 are added to the configuration of the first embodiment. Ends of the resistors 41 and 42 are respectively connected to the output nodes 26 and 27 of the second differential amplifier circuit 12, while the other ends of the resistors 41 and 42 are connected to the bases or gates of the transistors 31 and 32.

That is, the resistors 41 and 42 are provided in an active feedback route from the output nodes 26 and 27 of the second differential amplifier circuit 12 to the bases or gates of the transistors 31 and 32.

Ends of the capacitors 43 and 44 are respectively connected to the bases or gates of the transistors 31 and 32, i.e., the active feedback route, while the other ends of the capacitors 43 and 44 are connected to the low-voltage power supply Vss. The capacitance values of the capacitors 43 and 44 can be externally adjusted.

The output signal from the active feedback circuit 13 is delayed relative to the output signal from the first differential amplifier circuit 11. The amount of this delay is determined by the amount of switching delay through the second differential amplifier 12 and the active feedback circuit 13 and the CR time constant of the resistors 41 and 42 and the capacitors 43 and 44.

Therefore, the amount of delay can be adjusted by adjusting the capacitance values of the capacitors 43 and 44. The peaking width of the output signal from the first differential amplifier circuit 11 corresponding to the amount of delay can be adjusted in this way.

A PMOS-substrate varactor, an NMOS-substrate varactor or a MIM capacitor can be used as the capacitors 43 and 44 capable of capacitance value adjustment.

Figure 4:
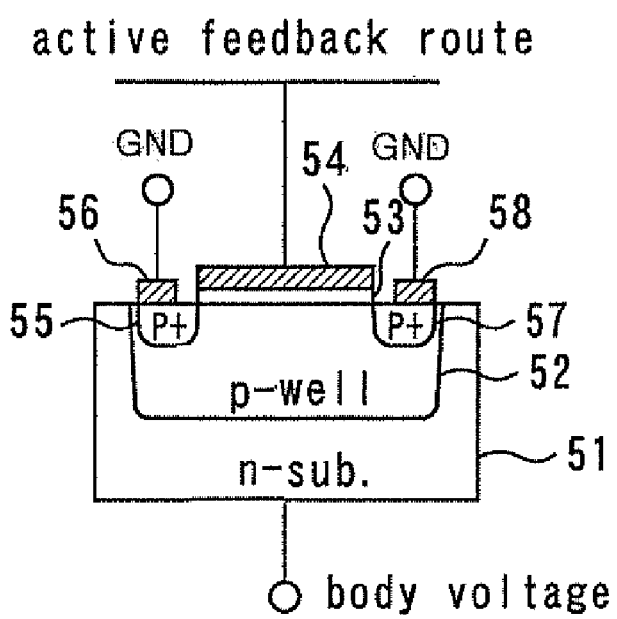
FIG. 4 is a sectional view of a PMOS-substrate varactor.
Figure 5:
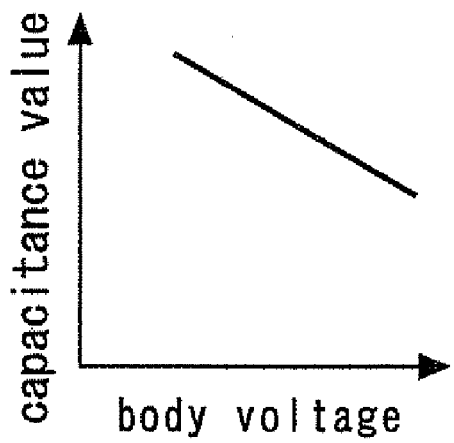
FIG. 5 shows the characteristic of this PMOS-substrate varactor.

FIG. 4 is a sectional view of a PMOS-substrate varactor. As shown in FIG. 4, a P-type well 52 is formed in an N-type substrate 51, and a gate insulating film 53 and a gate electrode 54 are formed on the P-type well 52. Also, a source region 55 and a drain region 57 are formed in the P-type well 52, and a source electrode 56 and a drain electrode 58 are formed on the source region 55 and the drain region 57. The gate electrode 54 is connected to the active feedback route and adjustment of the body voltage from the outside is made possible. Thus, an accumulation-type MOS capacitor is used as a varactor. FIG. 5 shows the characteristic of this PMOS-substrate varactor.

In the case of use of this PMOS-substrate varactor, the varactor capacitance is reduced when the body voltage is lowered, thereby reducing the CR time constant and, hence, the amount of delay of the feedback signal. The peaking width of the output signal from the first differential amplifier circuit can be reduced in this way. Conversely, the peaking width can be increased by increasing the body voltage.

Figure 6:
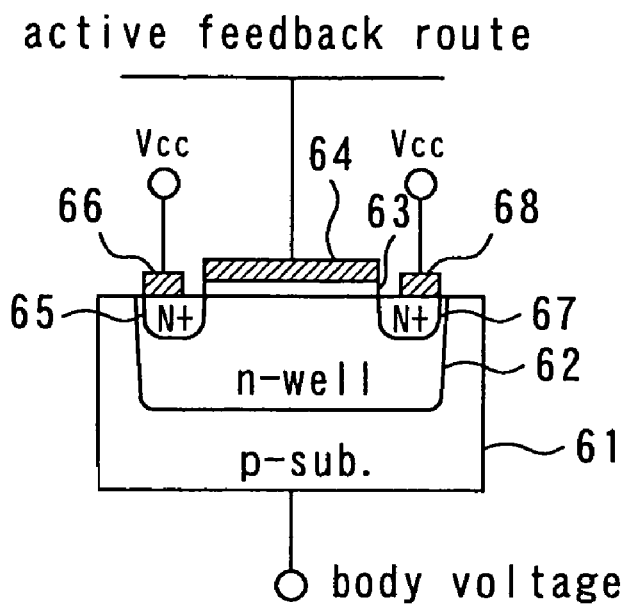
FIG. 6 is a sectional view of an NMOS-substrate varactor.
Figure 7:
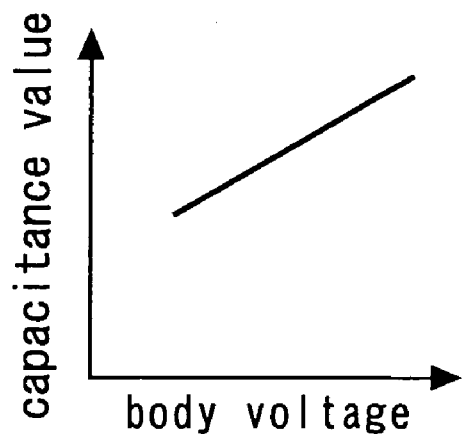
FIG. 7 shows the characteristic of this NMOS-substrate varactor.

FIG. 6 is a sectional view of an NMOS-substrate varactor. As shown in FIG. 6, an N-type well 62 is formed in a P-type substrate 61, and a gate insulating film 63 and a gate electrode 64 are formed on the N-type well 62. Also, a source region 65 and a drain region 67 are formed in the N-type well 62, and a source electrode 66 and a drain electrode 68 are formed on the source region 65 and the drain region 67. The gate electrode 64 is connected to the active feedback route and adjustment of the body voltage from the outside is made possible. FIG. 7 shows the characteristic of this NMOS-substrate varactor.

This NMOS-substrate varactor is reversed in polarity relative to the PMOS-substrate varactor but has the same effect as that of the PMOS-substrate varactor.

In a case where a MIM capacitor is used, not only the same effect but also an improvement in accuracy of the capacitance value in comparison with the use of the MOS capacitor can be achieved. In this case, therefore, the peaking intensity can be made closer to the design value.

Obviously many modifications and variations of the present invention are possible in the light of the above teachings. It is therefore to be understood that within the scope of the appended claims the invention maybe practiced otherwise than as specifically described.

The entire disclosure of a Japanese Patent Application No. 2004-267838, filed on Sep. 15, 2004 including specification, claims, drawings and summary, on which the Convention priority of the present application is based, are incorporated herein by reference in its entirety.

What is claimed is:

1. An amplifier circuit comprising:
a first differential amplifier circuit including
   first and second resistors,
   first and second transistors having collectors or drains connected to a high-voltage power supply through the first and second resistors, respectively, and connected to first and second output nodes of the first differential amplifier, bases or gates connected to first and second input nodes of the first differential amplifier circuit, respectively, and emitters or sources connected in common, and
   a first controllable current source having a first end connected to the emitters or sources of the first and second transistors, a second end connected to a low-voltage power supply, and an input terminal for receiving a bias signal for externally adjusting the current of the first controllable current source;
a second differential amplifier circuit which amplifies output signals from the first and second output nodes of the first differential amplifier circuit; and
an active feedback circuit shaping waveforms of the output signals from the first and second output nodes of the first differential amplifier circuit by feeding back output signals from first and second output nodes of the second differential amplifier circuit, wherein the active feedback circuit includes
   third and fourth transistors having collectors or drains connected to the first and second output nodes of the first differential amplifier circuit, respectively, and connected to first and second input nodes of the second differential amplifier circuit, bases or gates connected to the first and second output nodes of the second differential amplifier circuit, respectively, and emitters or sources connected in common, and
   a second controllable current source having a first end connected to the emitters or sources of the third and fourth transistors, a second end connected to the low-voltage power supply, and an input terminal for receiving a bias signal for externally adjusting the current of the second controllable current source, the input terminals of the first and second controllable current sources not being connected together, whereby the currents produced by the first and second controllable current sources may be independently adjusted.

2. The amplifier circuit according to claim 1 further comprising first and second capacitors having first ends connected to the bases or gates of the third and fourth transistors, respectively, and second ends connected to the low-voltage power supply, the first and second capacitors having respective capacitances that can be externally adjusted.

3. The amplifier circuit according to claim 2, wherein each of the first and second capacitors is one of a PMOS-substrate varactor, an NMOS-substrate varactor, and a MIM capacitor.

4. The amplifier circuit according to claim 1, wherein the second differential amplifier circuit includes:
   third and fourth resistors;
   fifth and sixth transistors having collectors or drains connected to the high-voltage power supply though the third and fourth resistors, respectively, and connected to the first and second output nodes of the second differential amplifier circuit bases or gates respectively connected to the first and second input nodes of the second differential amplifier circuit, respectively, and emitters or sources connected in common; and
   a current source having a first end connected to the emitters or sources of the fifth and sixth transistors and a second end connected to the low-voltage power supply.

5. The amplifier circuit according to claim 1, wherein the collectors or drains of the third and fourth transistors are connected to the high-voltage power supply exclusively through the first and second resistors, respectively.

* * * * *